(12) United States Patent
Ko et al.

(10) Patent No.: US 6,600,434 B2
(45) Date of Patent: Jul. 29, 2003

(54) A/D CONVERSION DEVICE AND A/D CONVERTER ERROR CORRECTION DEVICE

(75) Inventors: Shunichi Ko, Kawasaki (JP); Kiyoko Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/078,359

(22) Filed: Feb. 21, 2002

(65) Prior Publication Data
US 2003/0034906 A1 Feb. 20, 2003

(30) Foreign Application Priority Data
Aug. 14, 2001 (JP) ........................................ 2001-246282

(51) Int. Cl.[7] ............................................... H03M 1/00
(52) U.S. Cl. ........................ 341/120; 341/118; 341/155; 341/158; 341/159
(58) Field of Search ................................ 341/118, 120, 341/155, 158, 159

(56) References Cited

U.S. PATENT DOCUMENTS

| | | | | |
|---|---|---|---|---|
| 4,549,165 A | * | 10/1985 | Brian ........................... 340/347 |
| 4,973,974 A | * | 11/1990 | Suzuki ......................... 341/118 |
| 4,998,106 A | * | 3/1991 | Koga et al. ................... 341/139 |
| 5,034,745 A | * | 7/1991 | Kelly .......................... 341/155 |
| 5,592,167 A | * | 1/1997 | Caruso et al. ............... 341/159 |
| 5,675,339 A | * | 10/1997 | Andren et al. ............... 341/155 |
| 5,793,319 A | * | 8/1998 | Ard .............................. 341/120 |

* cited by examiner

*Primary Examiner*—Michael Tokar
*Assistant Examiner*—Khai M. Nguyen
(74) *Attorney, Agent, or Firm*—Arent Fox Kintner Plotkin & Kahn

(57) ABSTRACT

A zero transition voltage and a full transition voltage are inputted into the A/D converter, digital converted values of these voltages are fed back to a device fluctuation correction circuit and H side and L side reference voltages AVRH and AVRL are determined so as to obtain digital outputs corresponding to the respective transition voltages. Also, the digital output of the A/D converter is fed back to a high resolution corresponding circuit and a difference between AVRL and AVRH is decreased to be half as before by changing AVRL or AVRH according to an analog input voltage applied to the A/D converter and A/D conversion is performed again. By repeating this operation, significant bit values are obtained. A merge circuit merges the significant bit values with less significant bit values outputted from the A/D converter.

9 Claims, 8 Drawing Sheets

A/D CONVERSION DEVICE AND A/D CONVERTER ERROR CORRECTION DEVICE

FIELD OF THE INVENTION

The present invention relates to an A/D conversion device having a tuning function and an A/D converter error correction device for realizing the tuning function of an A/D converter.

BACKGROUND OF THE INVENTION

In recent years, the number of systems for converting an analog signal into a digital signal and conducting fine control based on a micro change in the digital signal increases. A system of this type requires a high accuracy A/D converter or a high resolution A/D converter. Normally, if device technology develops and a device becomes small in size, it becomes difficult to control a reference transition voltage related to the A/D converter. To manufacture a high accuracy A/D converter, however, it is necessary to suppress fluctuation in this reference transition voltage.

Further, the resolution of an A/D converter is normally fixed and various resolutions cannot be provided to a single A/D converter. Due to this, to manufacture a high accuracy A/D converter, it is necessary to prepare an A/D converter having a resolution required by a system for each resolution.

FIG. 1 is a block diagram showing the configuration of a conventional A/D conversion device for obtaining a highly accurate digital converted value. As shown in FIG. 1, this A/D conversion device is constituted so that an analog input voltage is amplified by an amplifier 11, the amplified voltage is subjected to A/D conversion by an A/D conversion circuit 12, and the obtained digital converted value is supplied to, for example, a central processing unit or CPU 13.

FIG. 2 is a block diagram showing another configuration of a conventional A/D conversion device for obtaining a highly accurate digital converted value. As shown in FIG. 2, this A/D conversion device is constituted so that an analog input voltage value is converted into a digital value by an A/D conversion circuit 16, the digital converted value is subjected to an error correction using a correction value stored in a register 18 by an arithmetic section 17 and a digital output value is thereby obtained. Each of the A/D converters 12 and 16 employed herein as shown in FIGS. 1 and 2 includes, as an analog voltage comparison circuit, resistors and capacitors as many as bits according to resolution.

The A/D conversion device wherein an analog input voltage is amplified and then subjected to A/D conversion has disadvantages in that an error occurs to the analog voltage value when the analog input voltage value is amplified by the amplifier and that an error derived from fluctuation in the reference transition voltage of the A/D conversion circuit 12 occurs.

Furthermore, the A/D conversion device wherein a digital converted value is subjected to arithmetic operation to correct an error has a disadvantage in that it takes long time to obtain error corrected data since each digital converted value is subjected to an arithmetic operation. Besides, since the resolution of the A/D conversion device is determined according to the number of resistors and capacitors mounted on the A/D conversion device at the time of manufacturing the conversion device, A/D conversion cannot be performed with the fixed resolution and varied resolutions cannot be, therefore, obtained with a single configuration.

SUMMARY OF THE INVENTION

It is an object of the present invention to provide an A/D conversion device which can dispense with an amplifier for amplifying an analog input voltage and an arithmetic circuit for performing an error correction arithmetic operation and which has a function to correct an error derived from fluctuation in a reference transition voltage unique to a product.

It is another object of the present invention to provide an A/D converter error correction device for realizing a function to correct an error derived from fluctuation in a reference transition voltage unique to a product. It is still another object of the present invention to provide an A/D conversion device for realizing an A/D converter having a high resolution.

FIG. 3 is a principle view which shows the configuration of a high accuracy A/D conversion device according to the present invention. This A/D conversion device is constituted as follows. As shown in FIG. 3, a zero transition voltage is inputted, as an analog input, into an A/D converter 21 and a digital converted value obtained by the A/D converter 21 is fed back to a device fluctuation correction circuit 23 by a feedback circuit 22. Likewise, a full transition voltage is inputted into the A/D converter 21 and an A/D converted value obtained by the A/D converter 21 is fed back to the device fluctuation correction circuit 23. Then, the error of the full transition voltage is converted into an analog voltage through a full transition voltage correction D/A converter 24 and the resultant analog voltage is supplied, as an H (a high) side reference voltage AVRH, to the A/D converter 21.

Likewise, the error of the zero transition voltage is converted into an analog voltage by D/A converter 25 for correction of the zero transition voltage and the resultant analog voltage is supplied, as an L (a low) side reference voltage AVRL, to the A/D converter 21. By doing so, it is possible to correct the error of the full transition voltage and the error of the zero transition voltage and to thereby improve the accuracy of the A/D converter 21.

FIG. 4 is a principle view which shows the configuration of a high resolution A/D conversion device according to the present invention. This A/D conversion device is constituted as follows. As shown in FIG. 4, first, an analog input voltage value is converted into a digital value by an A/D converter 31 while setting the H side reference voltage AVRH of the A/D converter 31 at a power source voltage Vcc and the L side reference voltage AVRL thereof at 0 V. The obtained A/D converted value is fed back to a high resolution corresponding circuit 36 by a feedback circuit 32, the A/D converted value thus fed back is stored in the internal register or the like of the circuit 36 and it is determined whether the analog input voltage is not less than ½ Vcc or not more than ½ Vcc.

If the analog input voltage is not less than ½ Vcc, the high resolution corresponding circuit 36 controls the output of an AVRL adjustment D/A converter 35 and raises the L side reference voltage AVRL to ½ Vcc. On the other hand, if the analog input voltage is not more than ½ Vcc, the high resolution corresponding circuit 36 controls the output of an AVRH adjustment D/A converter 34 to decrease the H side reference voltage AVRL to ½ Vcc. As stated above, after the difference between the H side reference voltage AVRH and the L side reference voltage AVRL is decreased to half the original difference, A/D conversion is carried out again, thereby making it possible to carry out the A/D conversion with a resolution twice as high as the original resolution.

This operation is repeated by a desired number of times. Then, an additional digital value stored in the high resolution corresponding circuit 36 is assumed as a significant bit value, the digital converted value obtained in the A/D converter 31 is assumed as a less significant bit value and the significant bit value and less significant bit value are merged with each other by a merge circuit 37 to thereby obtain a digital converted value having a desired number of bits. It is noted that the number of times of repetition of A/D conversion with a resolution twice as high as the original resolution is set by a counter or the like included in the high resolution corresponding circuit 36. By doing so, it is possible to perform A/D conversion with a desired resolution and to thereby realize an A/D converter having a higher resolution.

Other objects and features of this invention will become understood from the following description with reference to the accompanying drawings.

DETAILED DESCRIPTIONS

Figure 1:
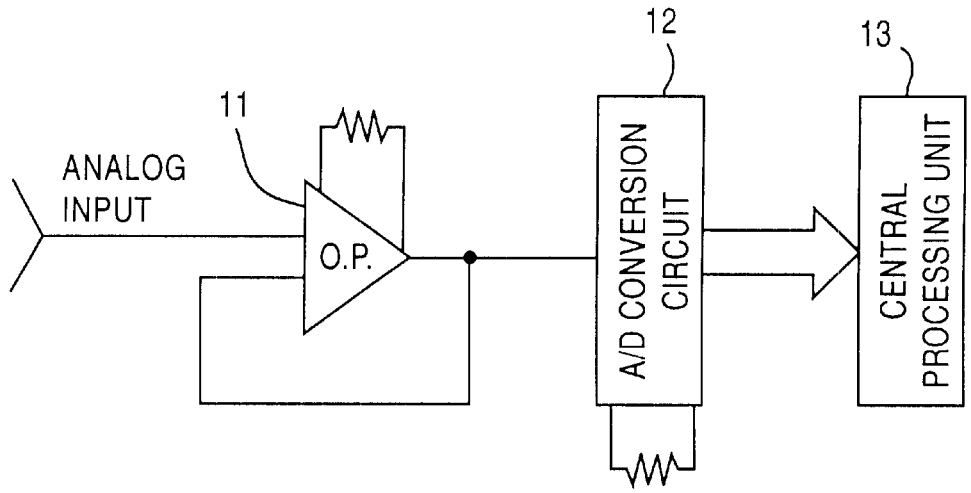
FIG. 1 is a block diagram showing the schematic of a conventional high accuracy A/D conversion device.
Figure 2:
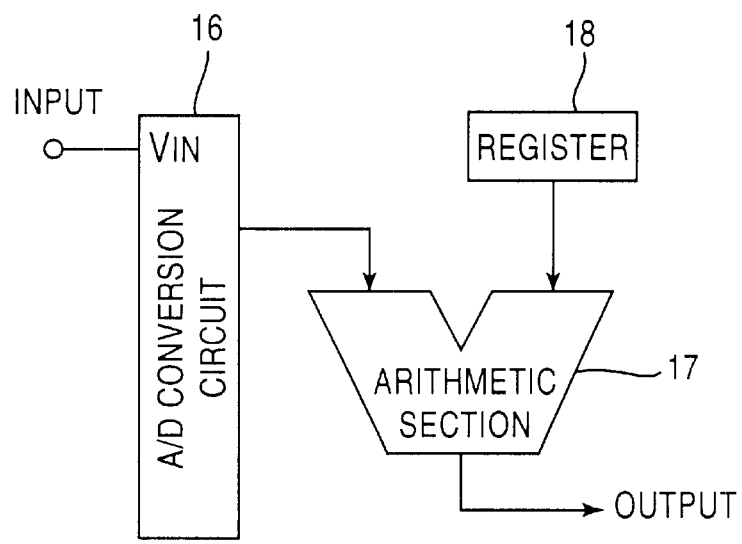
FIG. 2 is a block diagram showing the schematic of a conventional high accuracy A/D conversion device.
Figure 3:
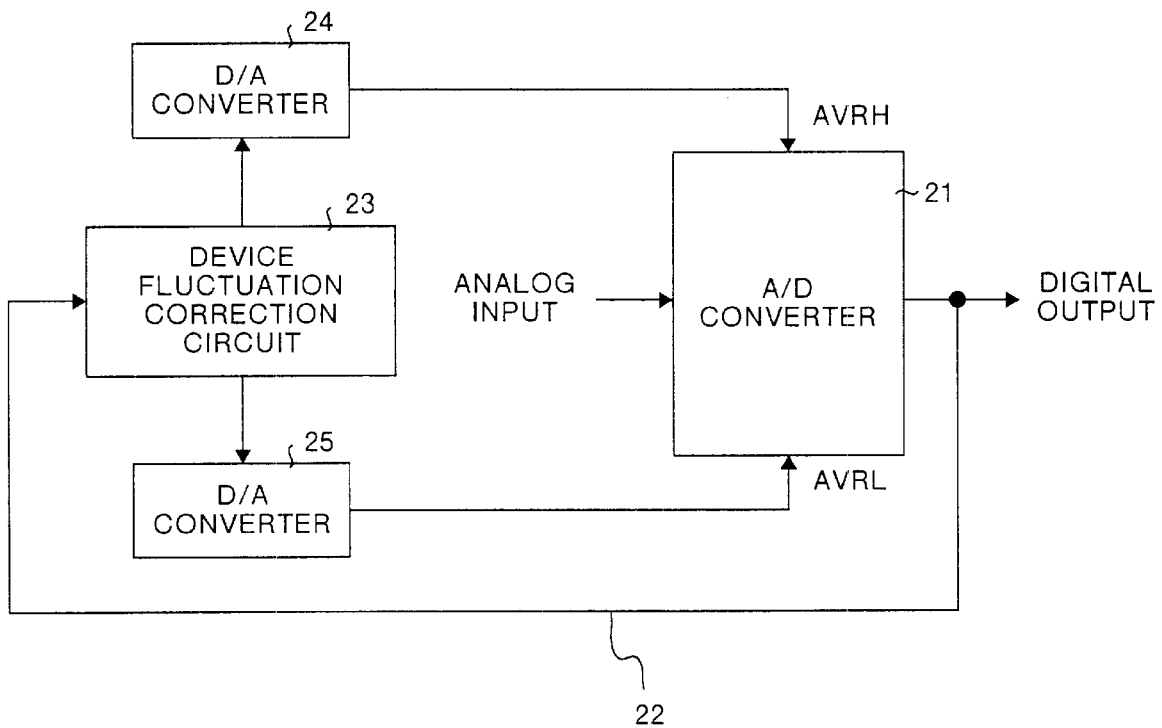
FIG. 3 is a principle view which shows the configuration of a high accuracy A/D conversion device according to the present invention.
Figure 4:
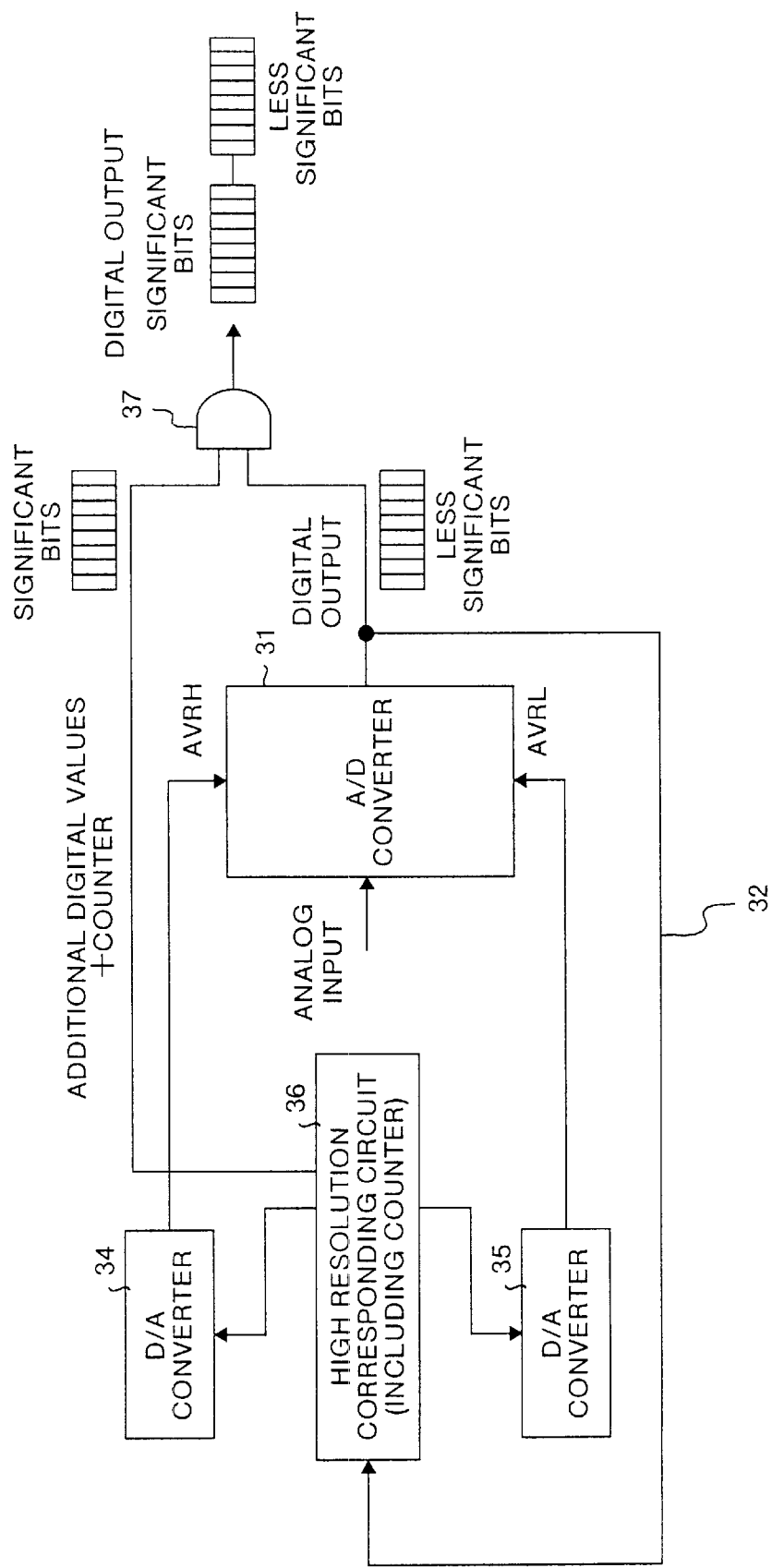
FIG. 4 is a principle view which shows the configuration of a high resolution A/D conversion device according to the present invention.
Figure 5:
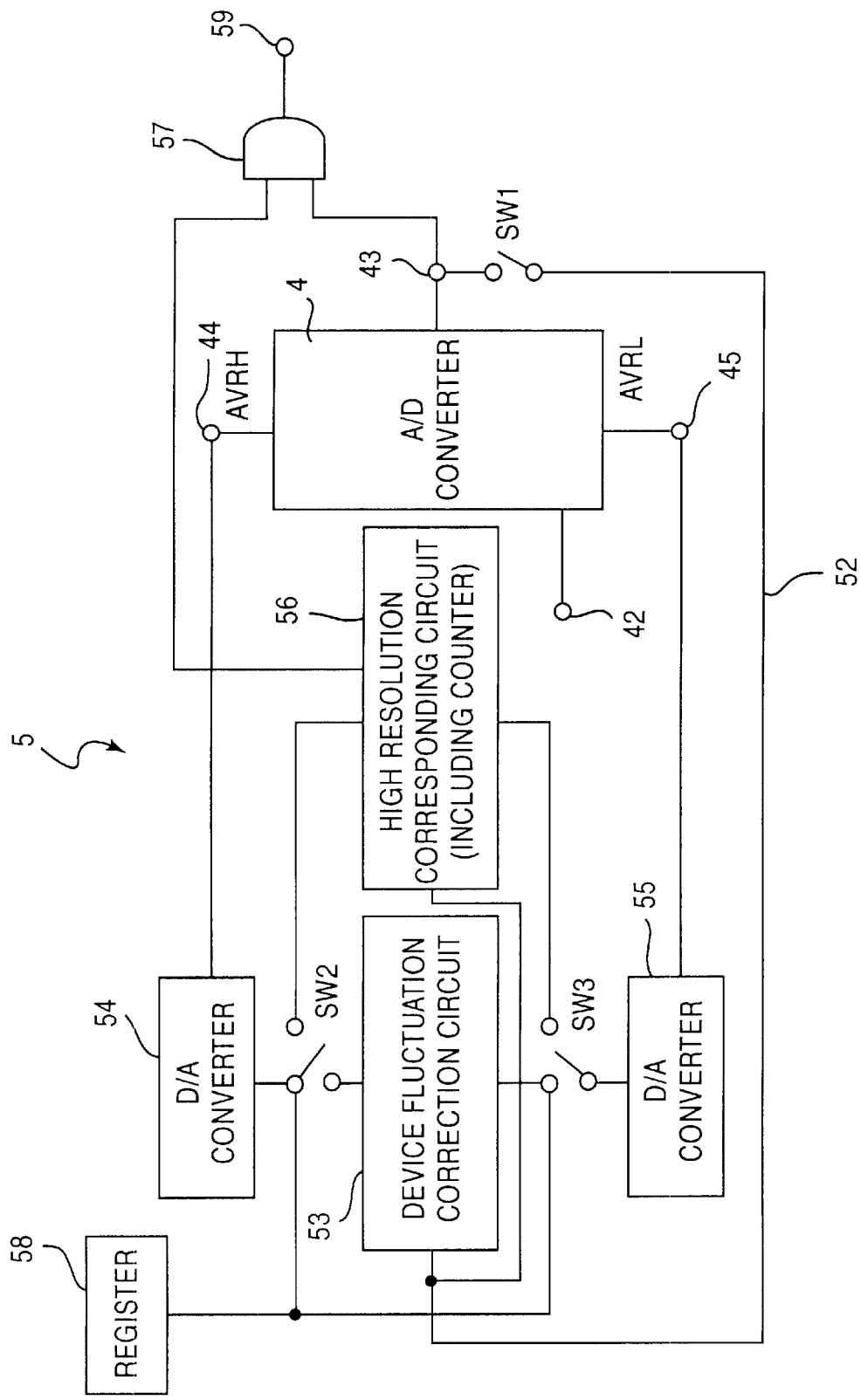
FIG. 5 is a block diagram showing one example of the configuration of an A/D conversion device according to one embodiment of the present invention.

The embodiment of the present invention will be described hereinafter in detail with reference to the drawings. FIG. 5 is a block diagram showing one example of the configuration of an A/D conversion device 5 according to one embodiment of the present invention. As shown in FIG. 5, this A/D conversion device 5 includes an A/D converter 4, a feedback circuit 52, a device fluctuation correction circuit 53, an AVRH side D/A converter 54, an AVRL side D/A converter 55, a high resolution corresponding circuit 56, a merge circuit 57, a register 58, an output terminal 59 and three switches SW1, SW2 and SW3 for the overall A/D conversion device 5.

The A/D converter 4 includes an input terminal 42 through which an analog voltage is inputted into the A/D converter 4, an output terminal 43 outputting a digital value obtained by A/D converting the analog input voltage inputted into the A/D converter 4 through the input terminal 42, an AVRH input terminal 44 applied with an H side reference voltage AVRH, and an AVRL input terminal 45 applied with an L side reference voltage AVRL. The input terminal 42 of the A/D converter 4 serves as the input terminal of the overall A/D conversion device 5.

The feedback circuit 52 feeds back a digital output value outputted from the A/D converter 4 to the device fluctuation correction circuit 53 or the high resolution corresponding circuit 56. The first switch SW1 is provided in the course of the feedback circuit 52. This switch SW1 is closed if an error correction is conducted to the A/D converter 4 or the A/D conversion device 5 is operated with a higher resolution than the resolution of the A/D converter 4. The first switch SW1 is opened if the A/D converter 4 is operated with an ordinary resolution, i.e., the original resolution of the A/D converter 4 after the error of the A/D converter 4 is corrected.

The device fluctuation correction circuit 53 compares the digital output value of the A/D converter 4 fed back from the A/D converter 4 with a digital value corresponding to the analog input voltage inputted into the A/D converter 4 through the input terminal 42 when the error of the A/D converter 4 is corrected. Thereafter, the device fluctuation correction circuit 53 outputs the difference between the digital output value and the digital value corresponding to the analog input voltage, i.e., a digital value corresponding to the error to the AVRH side D/A converter 54 or the AVRL side D/A converter 55.

Although the analog input voltage at the time of correcting the error of the A/D converter 4 is not limited to a specific value, it is appropriate that the analog input voltage is, for example, a full transition voltage or a zero transition voltage. If the full transition voltage is inputted into the A/D converter 4 and an error correction is conducted, then a digital value corresponding to the difference between the digital output value of the A/D converter 4 and a digital value corresponding to the full transition voltage is outputted to the AVRH side D/A converter 54. If the zero transition voltage is inputted into the A/D converter 4 and an error correction is conducted, then a digital value corresponding to the difference between the digital output value of the A/D converter 4 and a digital value corresponding to the zero transition voltage is outputted to the AVRL side D/A converter 55.

Each of the AVRH side D/A converter 54 and the AVRL side D/A converter 55 converts the digital value corresponding to the error supplied from the device fluctuation correction circuit 53 into an analog voltage value. The analog voltage value outputted from the AVRH side D/A converter 54 is supplied, as an error correction for the H side reference voltage AVRH, to the AVRH input terminal 44. On the other hand, the analog voltage value outputted from the AVRL side D/A converter 55 is supplied, as an error correction for the L side reference voltage AVRL, to the AVRL input terminal 45.

Figure 6:
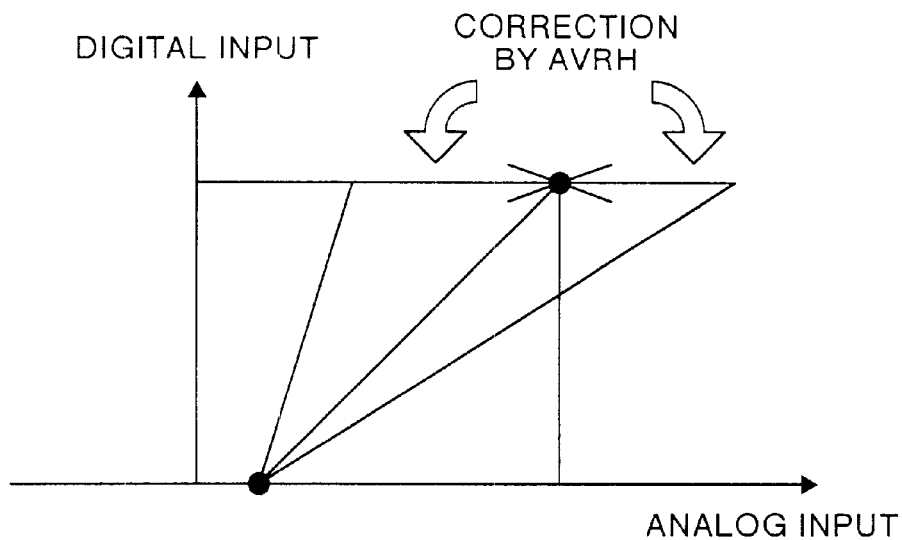
FIG. 6 is a typical view which shows a manner of correcting the error of the H side reference voltage AVRH of the A/D conversion device according to the embodiment of the present invention.
Figure 7:
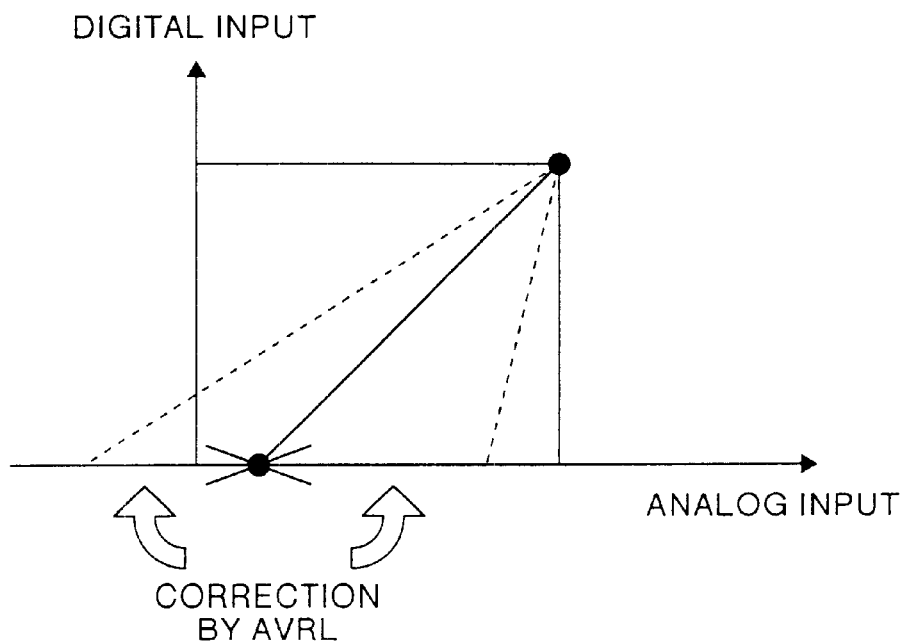
FIG. 7 is a typical view which shows a manner of correcting the error of the L side reference voltage AVRL of the A/D conversion device according to the embodiment of the present invention.

That is to say, as shown in FIG. 6, the error of the full transition voltage is corrected by controlling the H side reference voltage AVRH. The error of the zero transition voltage is corrected by controlling the L side reference voltage AVRL as shown in FIG. 7. As shown in FIGS. 6 and 7, when the full transition voltage is corrected, the correction does not depend on the zero transition voltage and when the zero transition voltage is corrected, the correction does not depend on the full transition voltage.

Meanwhile, since the zero transition voltage and the full transition voltage depend on a product, neither the zero transition voltage nor the full transition voltage change if the environment of the use of the A/D converter 4 has no change. Accordingly, if the use environment does not change, the error correction of the zero transition voltage and that of the full transition voltage maybe performed once, respectively and digital values corresponding to the respective errors may be stored. The register 58 is provided to store these digital values.

The AVRH D/A converter 54 and the AVRL side D/A converter 55 supply an error correction voltage for the H side reference voltage AVRH and that for the L side reference voltage AVRL to the A/D converter 4 based on the digital values corresponding to their respective errors stored in the register 58, respectively. In this case, the second and third switches SW2 and SW3 are provided to switch sources supplying the digital values to the AVRH D/A converter 54 and the AVRL D/A converter 55 between the device fluctuation correction circuit 53 and the register 58. By so providing, error correction operations for the zero transition voltage and the full transition voltage are not always performed, making it possible to promptly obtain a highly accurate digital converted value.

Figure 8:
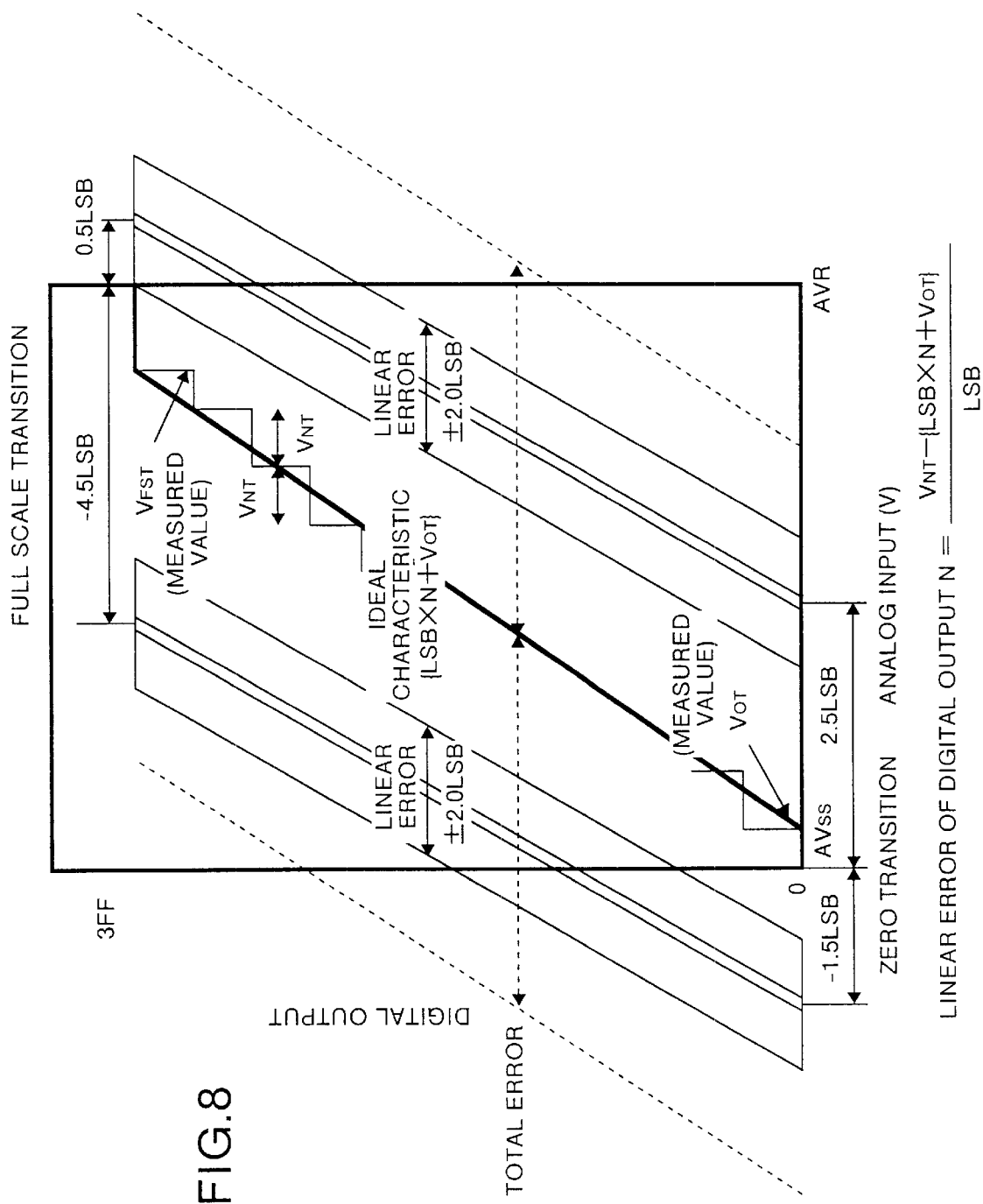
FIG. 8 is an explanatory view for the characteristic of the A/D conversion device according to the embodiment of the present invention before error correction.
Figure 9:
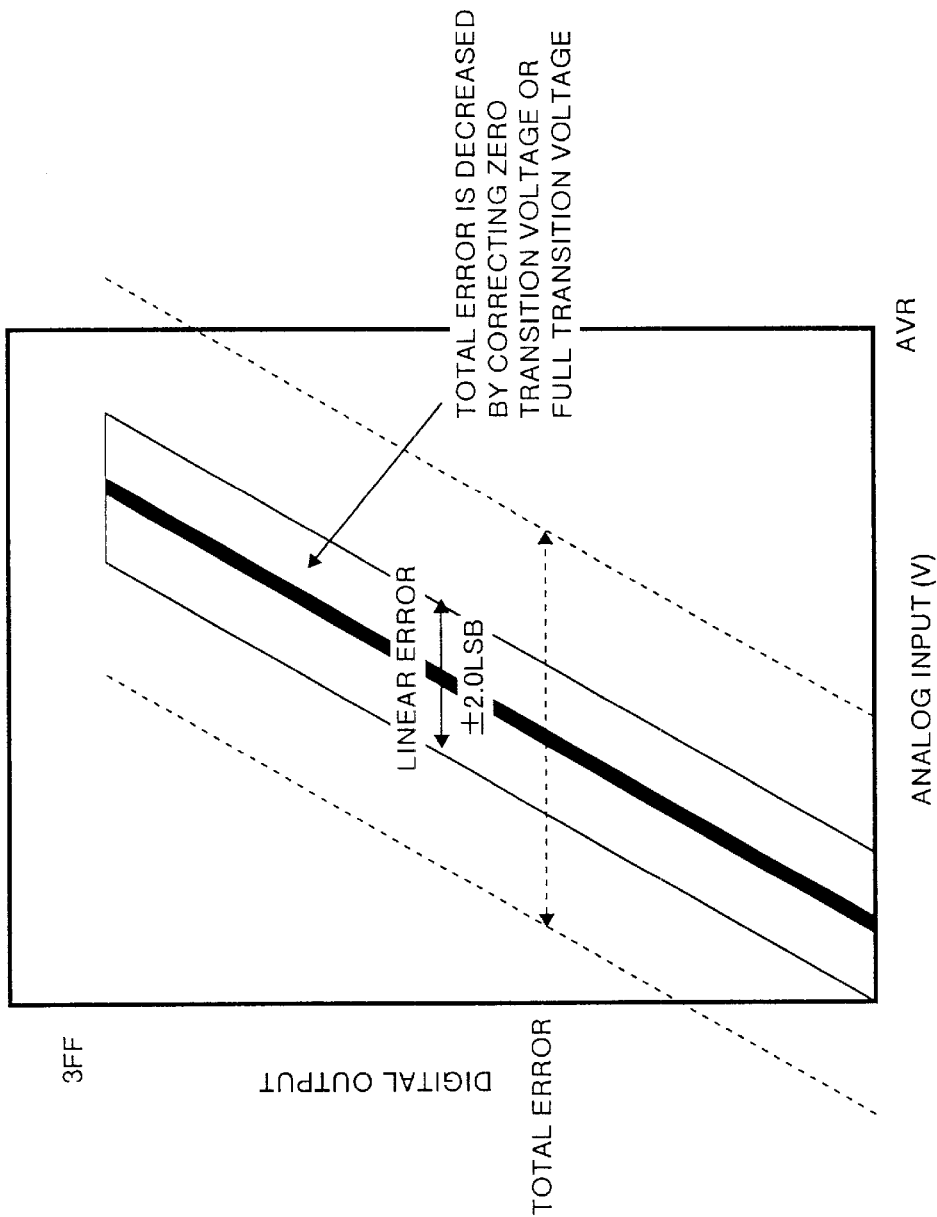
FIG. 9 is an explanatory view for the characteristic of the A/D conversion device according to the embodiment of the present invention after error correction.

FIGS. 8 and 9 are explanatory views for the characteristics of the A/D conversion device 5 constituted as stated above before and after the error correction, respectively. As shown in FIG. 8, before the error correction, the actual characteristic of the A/D conversion device 5 in respect of the analog-digital conversion characteristic of the A/D converter 4 is deviated from an ideal characteristic because of the error of the zero transition voltage and that of the full transition voltage. Since a linear error is estimated for the actual characteristic and, further, a total error is estimated therefor, the total error becomes large. As shown in FIG. 9, by contrast, after the error correction, the error of the zero transition voltage and that of the full transition voltage are eliminated. Accordingly, the actual characteristic coincides with the ideal characteristic and the total error becomes small as a whole.

Although not shown, the high resolution corresponding circuit 56 includes a counter for setting a resolution if the A/D conversion device 5 is operated with a higher resolution than that of the A/D converter 4 and a register storing significant bit values. The high resolution corresponding circuit 56 outputs digital values for controlling the H side reference voltage AVRH and the L side reference voltage AVRL to the AVRH side D/A converter 54 and the AVRL side D/A converter 55, respectively so that the difference between the H side reference voltage AVRH and the L side reference voltage AVRL becomes half as before, i.e., half as the difference before the H side reference voltage AVRH or the L side reference voltage AVRL is changed, in accordance with the digital output value of the A/D converter 4.

At this moment, the second and third switches SW2 and SW3 are switched so that the high resolution corresponding circuit 56 is connected to the AVRH side D/A converter 54 or the AVRL side D/A converter 55. The AVRH side D/A converter 54 and the AVRL side D/A converter 55 convert the digital values supplied from the high resolution corresponding circuit 56 into analog voltage values and supply the analog voltage values to the AVRH input terminal 44 and the AVRL input terminal 45, respectively.

To be specific, first, the A/D converter 4 performs digital conversion while the H side reference voltage AVRH is set at the power source voltage Vcc and the L side reference voltage AVRL is set at Vss (0V). The A/D converted value obtained is fed back to the high resolution corresponding circuit 56. If the obtained digital value is less than a digital value corresponding to ½ Vcc ((AVRH−AVRL)/2), "0" is stored, as the most significant bit, in the internal register which is not shown. If the obtained digital value is not less than the digital value corresponding to ½ Vcc ((AVRH−AVRL)/2), "1" is stored, as the most significant bit, in the internal register which is not shown. The high resolution corresponding circuit 56 then determines whether the analog input voltage at this time is not less than ½ Vcc or not more than ½ Vcc.

Figure 10:
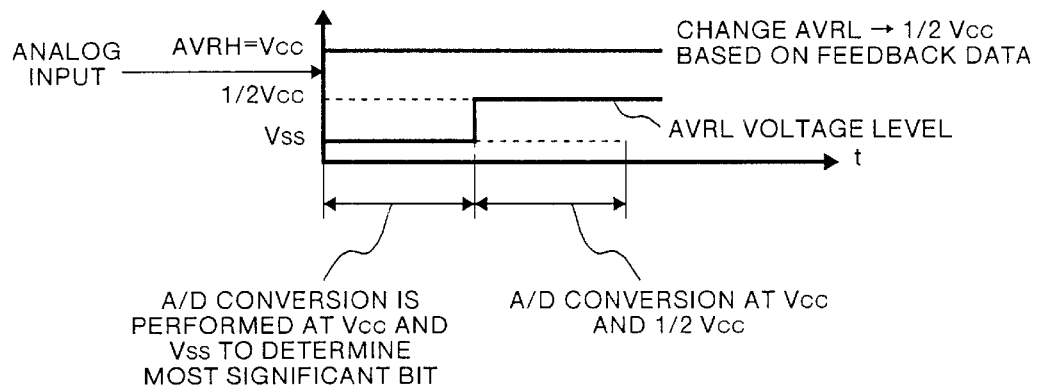
FIG. 10 is an explanatory view for the change of the reference voltage when the A/D conversion device according to the embodiment of the present invention performs a high resolution operation.

If it is determined that the analog input voltage is not less than ½ Vcc, the high resolution corresponding circuit 56 outputs an appropriate digital value to the AVRL side D/A converter 55 to control the output of the AVRL side D/A converter 55 as shown in FIG. 10. As a result, the L side reference voltage AVRL becomes ½ Vcc. Therefore, by performing the second A/D conversion with the H side reference voltage AVRH set at Vcc and the L side reference voltage AVRL set at ½ Vcc, A/D conversion is performed with a resolution twice as high as the original resolution.

Figure 11:
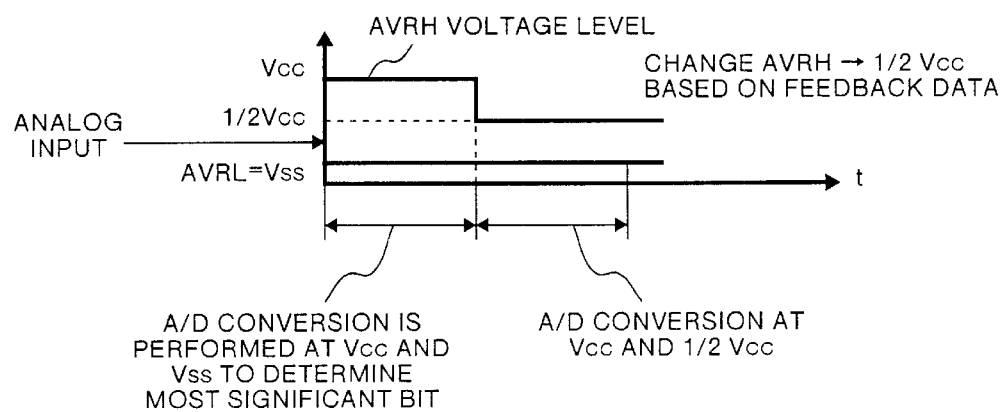
FIG. 11 is an explanatory view for the change of the reference voltage when the A/D conversion device according to the embodiment of the present invention performs a high resolution operation.

On the other hand, as shown in FIG. 11, if it is determined that the analog input voltage is not more than ½ Vcc, the high resolution corresponding circuit 56 controls the output of the AVRH side D/A converter 54 to set the H side reference voltage AVRH at ½ Vcc. Then, by performing the second A/D conversion with the H side reference voltage AVRH set at ½ Vcc and the L side reference voltage AVRL set at 0 V, A/D conversion is performed with a resolution twice as high as the original resolution. A value obtained by the second A/D conversion is fed back to the high resolution corresponding circuit 56. If the obtained digital value is less than a digital value corresponding to (AVRH−AVRL)/2, "0" is stored, as the second most significant bit, in the internal register of the high resolution corresponding circuit 56 which is not shown. If the digital value is not less than the corresponding digital value, "1" is stored, as the second most significant bit, in the internal register of the high resolution corresponding circuit 56 which is not shown.

In this way, A/D conversion is repeated until the counter of the high resolution corresponding circuit 56 which is not shown counts up while changing the difference between the H side reference voltage AVRH and the L side reference voltage AVRL becomes half so as to become half as before, thereby obtaining values on a one-bit-by-one-bit-basis in a descending order of significance. It is noted that the counter provided in the high resolution corresponding circuit 56 is constituted so as to be able to be set from outside.

The merge circuit 57 merges the digital value stored in the high resolution corresponding circuit 56 with the digital converted value obtained by the A/D converter 4 while assuming that the digital value as the most significant bit value and the digital converted value as the least significant bit value. As a result, a digital converted value having a desired number of bits is outputted from the output terminal 59 of the overall A/D conversion device 5. If a high resolution operation is not carried out, i.e., a digital value obtained with the original resolution of the A/D converter 4 is outputted, then the merge circuit 57 does not merge values and outputs the digital output value of the A/D converter 4 to the output terminal 59 as it is.

According to the embodiment stated above, the zero transition voltage and the full transition voltage are inputted into the A/D converter 4, the digital converted values of these voltages are fed back to the device fluctuation correction circuit 53 and H side and L side reference voltages AVRH and AVRL are determined so as to obtain digital outputs corresponding to the respective transition voltages. It is, therefore, possible to correct the error of the full transition voltage and the error of the zero transition voltage and to thereby improve the accuracy of the A/D converter. Also, not only fluctuation in the accuracy of the A/D converter 4 is corrected but also the reference voltages of the A/D converter 4 are regularly corrected, thereby making it possible to correct the change of the A/D converter 4 with the passage of time.

Furthermore, according to the above-stated embodiment, the digital output of the A/D converter 4 is fed back to the high resolution corresponding circuit 56, the difference between the H side reference voltage AVRH and the L side reference voltage AVRL is decreased to be half as before according to the analog input voltage applied to the A/D converter 4 and A/D conversion is carried out again. By repeating this operation, significant bit values are obtained. By merging the obtained significant bit values with the less significant bit values outputted from the A/D converter 4, it is possible to obtain a digital converted value having bits corresponding to a resolution exceeding the original resolution of the A/D converter 4. It is, therefore, possible to carry out A/D conversion with a desired resolution and to thereby realize an A/D converter having a higher resolution.

The present invention stated so far is not limited to the above-stated embodiment but various changes and modifications can be made. For example, if the A/D conversion device in this embodiment instead of the merge circuit 57 is included in a microcontroller or the like, the significant bit values stored in the high resolution corresponding circuit 56 may be merged with less significant bit values outputted from the A/D converter 4 in response to a merge instruction from the microcontroller or the like. Furthermore, an A/D converter error correction device may be constituted out of the constituent elements excluding the A/D converter 4 and the correction device may correct the error of an A/D converter manufactured separately from this correction device.

According to the present invention, the zero transition voltage and the full transition voltage are inputted into the A/D converter, and H side and L side reference voltages are determined so as to obtain digital outputs corresponding to the respective transition voltages. It is, therefore, possible to correct the error of the full transition voltage and the error of the zero transition voltage and to thereby improve the accuracy of the A/D converter.

In addition, according to the present invention, the digital output of the A/D converter is fed back to the high resolution corresponding circuit, the difference between the H side reference voltage and the L side reference voltage is decreased to be half as before by changing either the H side reference voltage or the L side reference voltage according to the analog input voltage applied to the A/D converter and A/D conversion is carried out again. Significant bit values obtained by repeating this operation by a desired number of times are merged with the less significant bit values outputted from the A/D converter, thereby obtaining a digital converted value having a desired number of bits. It is, therefore, possible to carry out A/D conversion with a desired resolution and to thereby realize an A/D converter having a higher resolution.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An A/D conversion device comprising:

an A/D converter that converts an input voltage having an analog value between a full transition voltage and a zero transition voltage into a digital value;

a device fluctuation correction circuit that is connected to the A/D converter through a feedback circuit and outputs a first voltage indicating a difference voltage between the full transition voltage and an output voltage fed back from the A/D converter and a second voltage indicating a difference voltage between the zero transition voltage and an output voltage fed back from the A/D converter so as to correct voltage errors both at the full transition voltage and the zero transition voltage;

a first D/A converter that is connected to the device fluctuation correction circuit and converts the first voltage into an analog value as a high side reference voltage; and a second D/A converter that is connected to the device fluctuation correction circuit and converts the second voltage into an analog value as a low side reference voltage, wherein the high side reference voltage and the low side reference voltage are supplied to the A/D converter so that a digital output value converted from a predetermined analog input voltage value of the A/D converter coincides with a digital value corresponding to the predetermined analog input voltage value.

2. The A/D conversion device according to claim 1, further comprising a register holding an adjustment quantity of the high side reference voltage and an adjustment quantity of the low side reference voltage of said A/D converter.

3. An A/D conversion device comprising:

an A/D converter converting an analog input voltage value into a digital value;

a first D/A converter converting a digital output voltage into a high side reference voltage;

a second D/A converter converting a digital output voltage into a low side reference voltage; and a high resolution corresponding circuit holding the digital value for a predetermined one bit corresponding to a digital output value of said A/D converter, and decreasing a voltage difference between the high side reference voltage and the low side reference voltage supplied to said A/D converter to half a voltage difference before the high side reference voltage said A/D converter is decreased or the low side reference voltage of said A/D converter is increased, by decreasing the high side reference voltage supplied to said A/D converter by said first D/A converter or increasing the low side reference voltage supplied to said A/D converter by said second D/A converter based on the digital output value.

4. The A/D conversion device according to claim 3, further comprising a merge circuit merging the digital value held by the high resolution corresponding circuit with the digital value outputted from said A/D converter while setting the digital value held by the high resolution corresponding circuit as a significant bit value and the digital value outputted from said A/D converter as a less significant bit value.

5. An A/D conversion device comprising:

an A/D converter converting an analog input voltage value into a digital value;

a first D/A converter converting a digital output voltage into a high side reference voltage;

a second D/A converter converting a digital output voltage into a low side reference voltage;

a device fluctuation correction circuit controlling the high side reference voltage and the low side reference voltage for supply to said A/D converter so that a digital output value converted from a predetermined analog input voltage value of said A/D converter coincides with a digital value corresponding to the predetermined analog input voltage value; and a high resolution corresponding circuit holding the digital value for a predetermined one bit corresponding to a digital output value of said A/D converter, and decreasing a voltage difference between the high side reference voltage and the low side reference voltage supplied to said A/D converter to half a voltage difference before the high side reference voltage of said A/D converter is decreased or the low side reference voltage of said A/D converter is increased, by decreasing the high side reference voltage supplied to said A/D converter by said first D/A converter or increasing the low side reference voltage supplied to said A/D converter by said second D/A converter based on the digital output value.

6. The A/D conversion device according to claim 5, further comprising a register holding an adjustment quantity of the high side reference voltage and an adjustment quantity of the low side reference voltage of said A/D converter.

7. The A/D conversion device according to claim 5, further comprising a merge circuit merging the digital value held by the high resolution corresponding circuit with the digital value outputted from said A/D converter while setting the digital value held by the high resolution corresponding circuit as a significant bit value and the digital value outputted from said A/D converter as a less significant bit value.

8. An A/D converter error correction device for correcting an error of a full transition voltage and an error of a zero transition voltage of an A/D converter converting an analog input voltage value into a digital value, comprising:

a device fluctuation correction circuit that is connected to a feedback circuit through which an output of the A/D converter is fed back and outputs a first voltage indicating a difference voltage between the full transition voltage and an output voltage fed back from the A/D converter and a second voltage indicating a difference voltage between the zero transition voltage and an output voltage fed back from the A/D converter so as to correct voltage errors both at the full transition voltage and the zero transition voltage;

a first D/A converter that is connected to the device fluctuation correction circuit and converts the first voltage into an analog value as a high side reference voltage; and a second D/A converter that is connected to the device fluctuation correction circuit and converts the second voltage into an analog value as a low side reference voltage, wherein the high side reference voltage and the low side reference voltage are supplied to the A/D converter so that a digital output value converted from a predetermined analog input voltage value of the A/D converter coincides with a digital value corresponding to the predetermined analog input voltage value.

9. The A/D converter error correction device according to claim 8, further comprising a register holding an adjustment quantity of the high side reference voltage and an adjustment quantity of the low side reference voltage of said A/D converter.

* * * * *